(12) United States Patent
Shirvani-Mahdavi et al.

(10) Patent No.: US 7,199,661 B1
(45) Date of Patent: Apr. 3, 2007

(54) VARIABLE GAIN AMPLIFICATION USING TAYLOR EXPANSION

(75) Inventors: Alireza Shirvani-Mahdavi, San Jose, CA (US); George Chien, Cupertino, CA (US)

(73) Assignee: Marvell International Ltd., Hamilton (BM)

( * ) Notice: Subject to any disclaimer, the term of this patent is extended or adjusted under 35 U.S.C. 154(b) by 105 days.

(21) Appl. No.: 11/029,194

(22) Filed: Jan. 3, 2005

Related U.S. Application Data

(60) Provisional application No. 60/535,195, filed on Jan. 8, 2004.

(51) Int. Cl.
*H03F 3/45* (2006.01)
(52) U.S. Cl. .................................. 330/254; 330/278
(58) Field of Classification Search ............ 330/254, 330/278, 257, 261, 279
See application file for complete search history.

(56) References Cited

U.S. PATENT DOCUMENTS

| 6,838,939 B2 * | 1/2005 | Jaussi ........................ 330/254 |
| 7,009,449 B2 * | 3/2006 | Habring et al. ............. 330/254 |

FOREIGN PATENT DOCUMENTS

JP 63-280505 * 11/1988

* cited by examiner

*Primary Examiner*—Henry Choe

(57) ABSTRACT

Circuits and methods are provided for variable gain amplification. In one implementation, a circuit is provided that includes a control circuit, an amplifier circuit, and a gain circuit. The control circuit receives a control signal and produces a current control signal, the current control signal being a ratio of a first current and a second current. The amplifier circuit is operable to apply a gain to an input voltage for producing an output voltage. The gain circuit is in communication with the control circuit and the amplifier circuit and receiving the current control signal, the gain circuit operable to adjust the gain responsive to a change in the control signal.

44 Claims, 4 Drawing Sheets

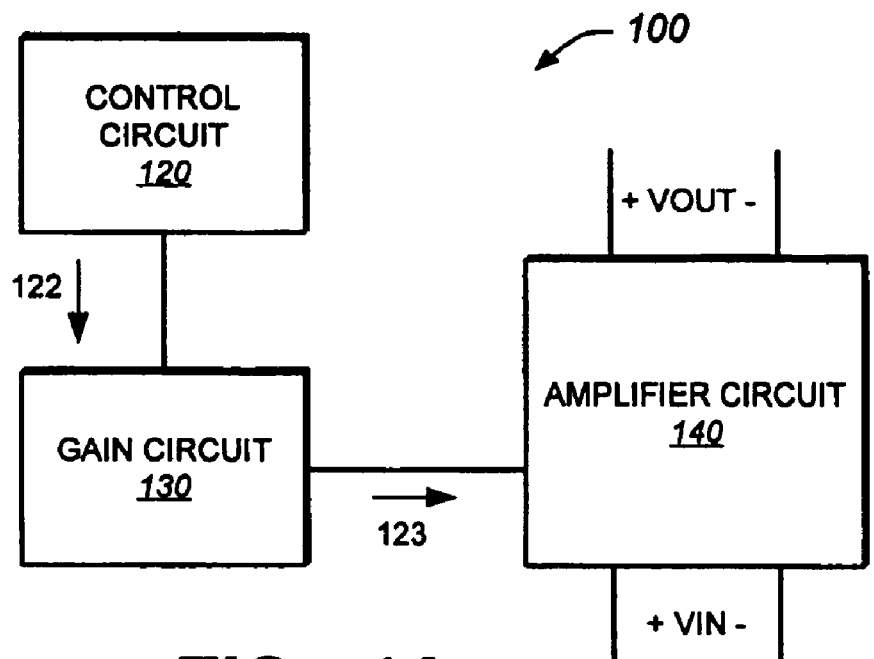
FIG._1A
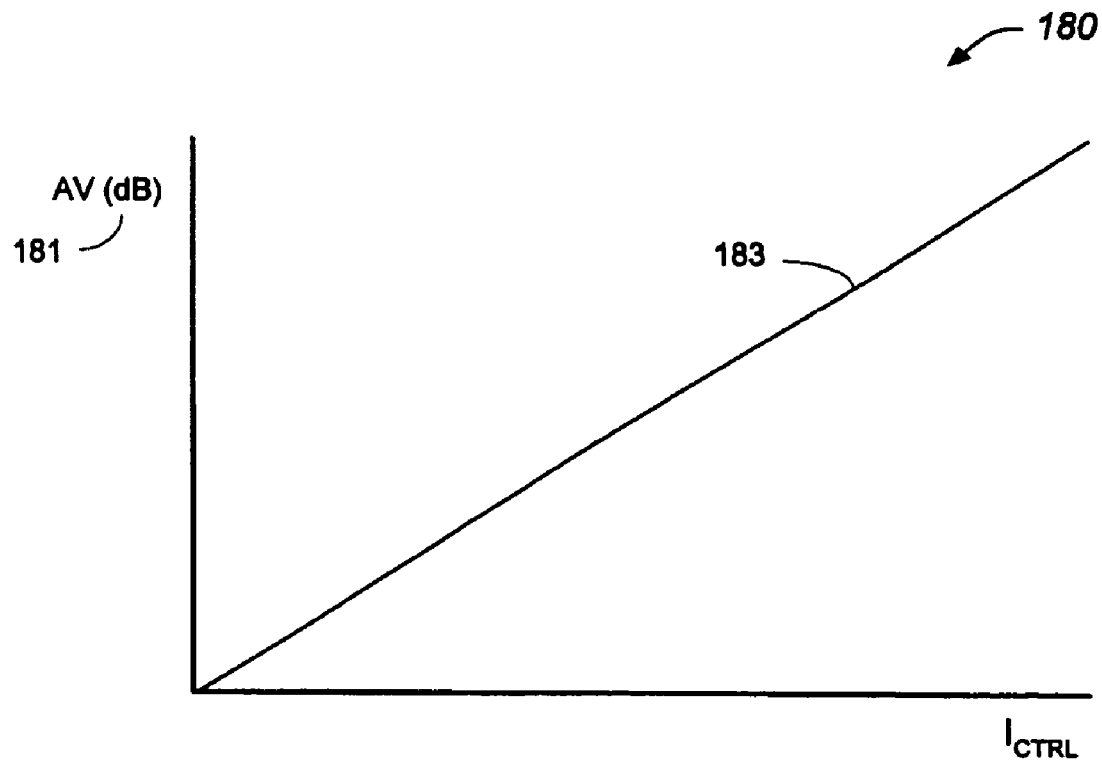
FIG._1B

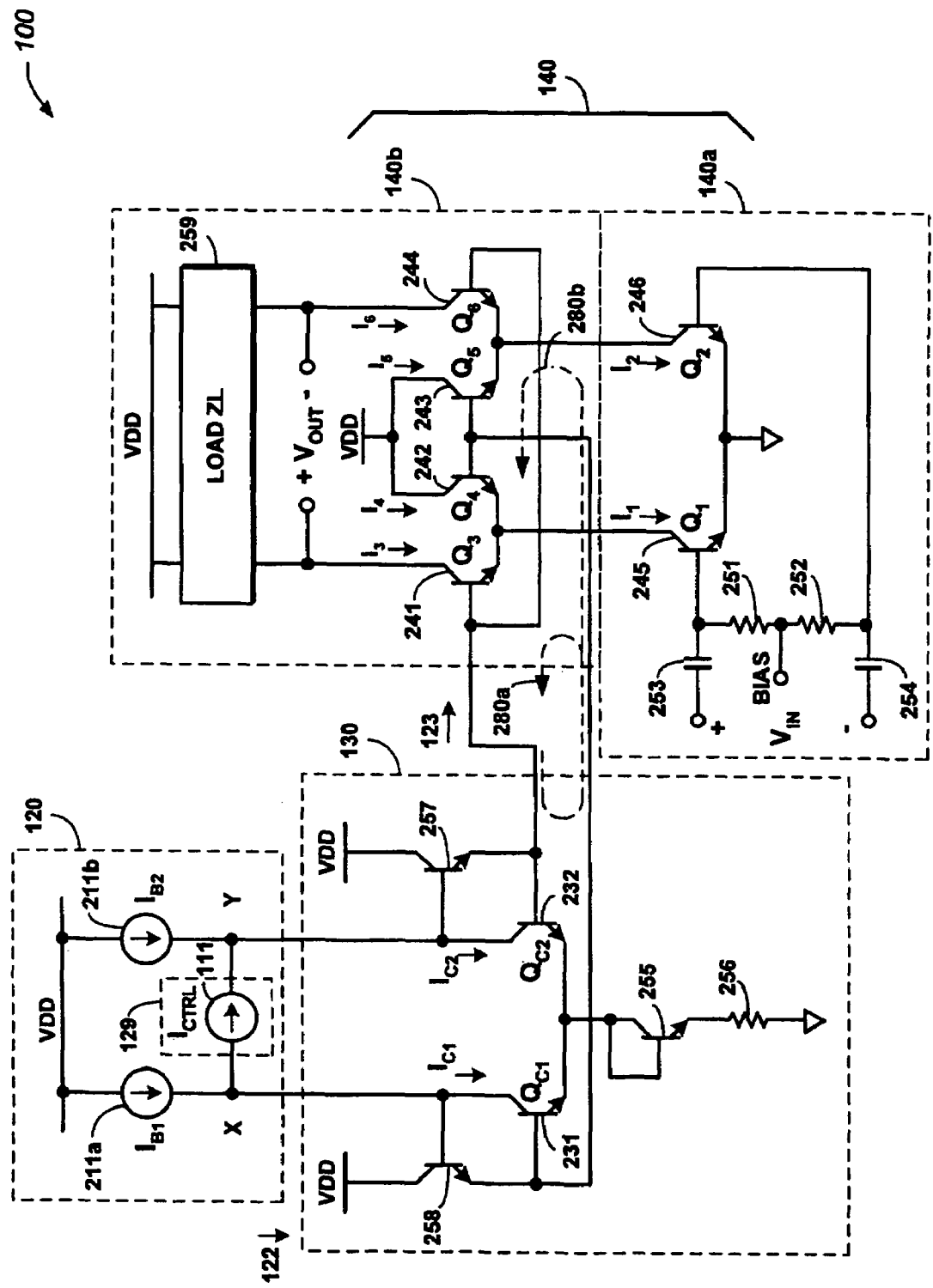
FIG._2

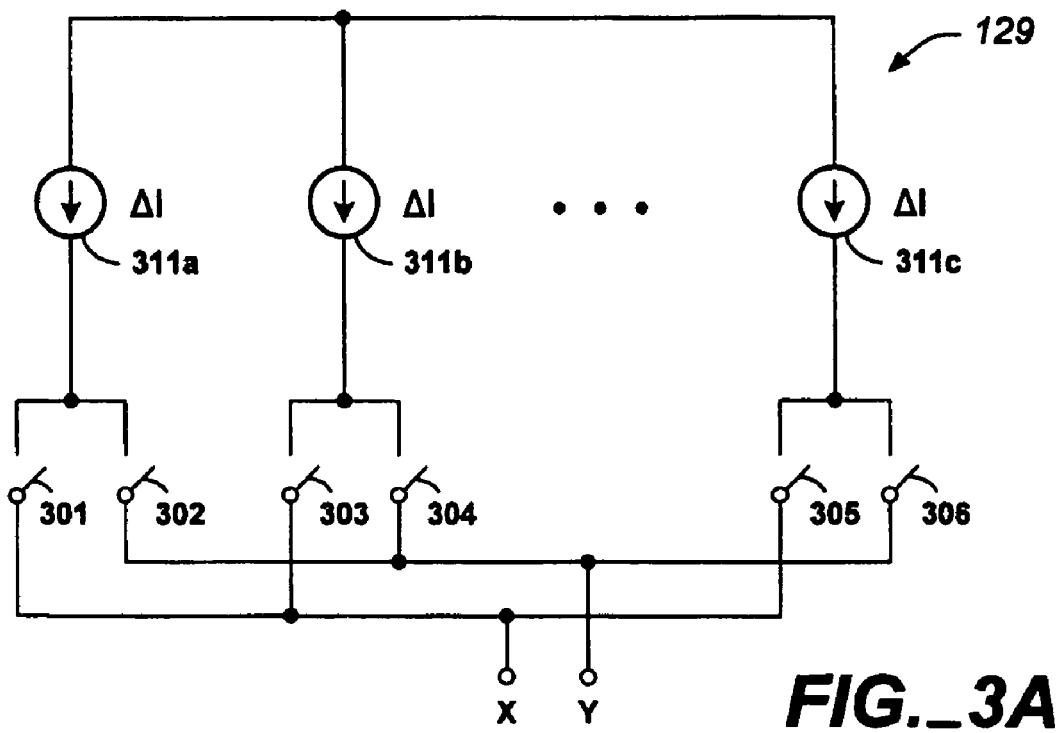
FIG._3A
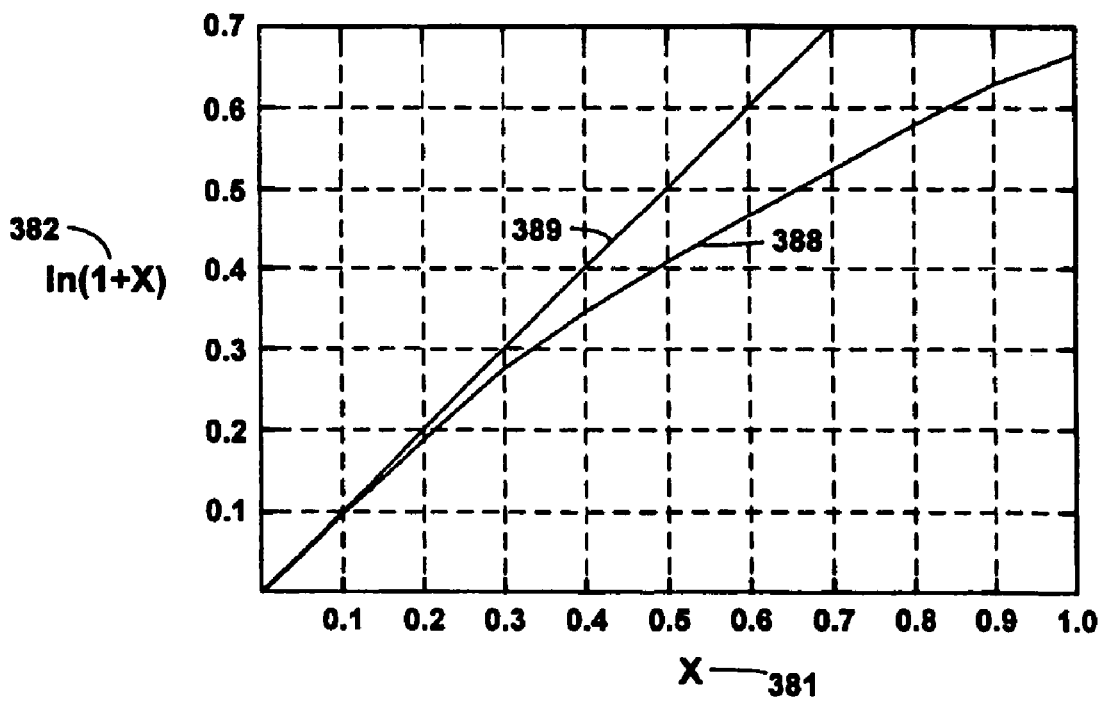
FIG._3B

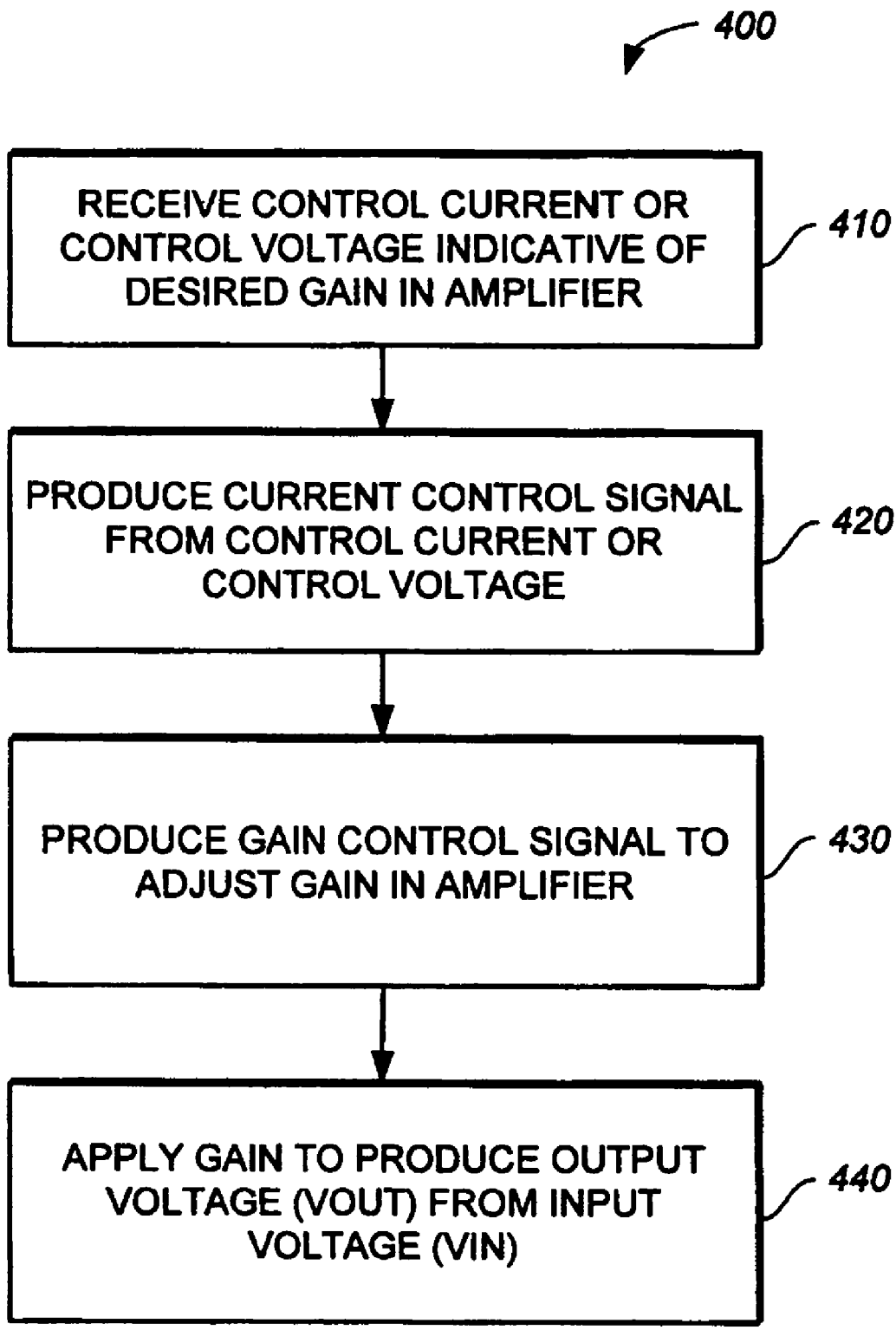
FIG._4

VARIABLE GAIN AMPLIFICATION USING TAYLOR EXPANSION

CROSS-REFERENCE TO RELATED APPLICATIONS

The present application claims priority to U.S. Provisional Patent Application No. 60/535,195, filed on Jan. 8, 2004, which is incorporated herein by reference in its entirety. The present application is related to U.S. application Ser. No. 11/028,900 entitled "DUAL REFERENCE CURRENT GENERATION USING A SINGLE EXTERNAL REFERENCE RESISTOR" which is commonly assigned and filed concurrently herewith, the contents of which is incorporated herein by reference.

BACKGROUND

The following disclosure generally relates to electrical circuits and signal processing.

Conventional amplifiers receive an input voltage VIN and produce an output voltage VOUT according to a gain AV, wherein the gain AV is defined as a ratio of the output voltage VOUT to the input voltage VIN. A variable gain amplifier permits changes in gain AV so as to adjust a signal level in the output signal.

Various conventional techniques can be used to control a gain AV of a variable gain amplifier. One type of gain control leverages an exponential property of a transistor (e.g., a bipolar junction transistor) to make exponential changes in gain AV. However, transistors are generally sensitive to conditions such as temperature, supply voltage fluctuations, and fabrication process variations. Consequentially, such adverse conditions can introduce errors into an application requiring an accurate output voltage $V_{OUT}$.

SUMMARY

This disclosure generally describes variable gain amplifier circuits and methods of varying gain amplification. In general, in one aspect, a variable gain amplifier circuit comprises: a control circuit operable to receive a control signal and to produce a current control signal, the current control signal being a ratio of a first current and a second current; an amplifier circuit, responsive to an input signal, to apply a gain to an input voltage for producing an output voltage; and a gain circuit in communication with the control circuit and the amplifier circuit and receiving the current control signal, the gain circuit operable to adjust the gain including adjusting the input signal responsive to a change in the control signal.

Particular implementations may include one or more of the following features. The variable gain amplifier circuit can be operable to substantially linearly adjust the gain on a logarithmic scale in response to an incremental change in the control signal. The gain circuit can adjust the gain to a predetermined accuracy level independent of variations in one or more conditions selected from the group including temperature, voltage supply level, and fabrication process. The gain circuit can produce a gain control signal to adjust the gain as a function of the control signal. The function can be one selected from the group including substantially exponential and parabolic. The control circuit can further comprise a current steering control operable to steer the current control signal responsive to adjustments in the control signal including incremental changes in a control current. The incremental changes to the control current can be nonlinear. The control circuit can further comprise a first current source in communication with a first node, the first current source operable to produce a first source current that is substantially larger than a control current associated with the control signal; and a second current source in communication with a second node, the second current source operable to produce a second source current substantially equal to the first source current; and a current steering control in communication with the first and second current sources, the current steering control operable to steer the current control signal responsive to adjustments in the control signal, such that the first node produces the first current and the second node produces the second current. The first current can substantially equate to the first source current less the control current, and the second current can substantially equate to the second source current plus the control current. The current steering control can be operable to produce the control signal. The gain circuit can produce a gain control signal to control the gain, and in response, the amplifier circuit can produce a fourth current and a third current proportional to the first current and the second current, the gain in the amplifier circuit being proportional to a ratio of the third current and a sum of the third and fourth currents.

In general, in another aspect, a variable gain amplifier circuit, comprises: a first input to receive a first source current; a second input to receive a second source current substantially equal to the first source current; a current steering control in communication with the first and second source currents, the current steering control operable to receive a control signal and steer a current control signal responsive to adjustments in the control signal including producing a first current and a second current; a gain circuit in communication with the current steering control including a first transistor operable to receive the first current and a second transistor operable to receive the second current; and an amplifier circuit including a third transistor operable to receive a third current and a fourth transistor operable to receive a fourth current, where the first, second, third and fourth transistors are coupled such that a ratio of the first and second currents is proportional to a ratio of the fourth and third currents, and produces a gain in the amplifier circuit as a ratio of the third current and a sum of the third and fourth currents.

In general, in another aspect, a method of varying gain amplification comprises: receiving a control signal; producing a current control signal, the current control signal being a ratio of a first current and a second current; applying a gain to an input voltage for producing an output voltage; and adjusting the gain responsive to a change in the control signal.

Particular implementations may include one or more of the following features. Adjusting the gain can include substantially linearly adjusting the gain on a logarithmic scale in response to an incremental change in the control signal. Adjusting the gain can include adjusting the gain to a predetermined accuracy level independent of variations in one or more conditions selected from the group including temperature, voltage supply level, and fabrication process. Adjusting the gain can include producing a gain control signal to adjust the gain as a function of the control signal. The function can be one selected from the group including substantially exponential and parabolic. The method can further comprise steering the current control signal responsive to adjustments in the control signal including incremental changes in a control current. The incremental changes to the control current can be nonlinear. The method can further comprise producing a first source current at a first node that is substantially larger than a control current associated with the control signal; and producing a second source current at a second node that is substantially equal to the first source current; and steering the current control signal responsive to adjustments in the control signal, such that the first node produces the first current and the second node produces the second current. The first current can substantially equate to the first source current less the control current, and the second current substantially equates to the second source current plus the control current. The method can further comprise producing the control signal. The method can further comprise producing a gain control signal to control the gain, and in response, producing a fourth current and a third current a ratio of which is proportional to a ratio of the first current and the second current, the gain being proportional to a ratio of the third current and a sum of the third and fourth currents.

In general, in another aspect, the method can comprise: producing a first source current; producing a second source current substantially equal to the first source current; receiving a control signal; steering a current control signal responsive to adjustments in the control signal including producing a first current and a second current; equating a ratio of a fourth current and a third current to a ratio of the first and second currents; and generating a gain as a ratio of the third current and a sum of the third and fourth currents.

In general, in another aspect, a variable gain amplifier circuit comprises: first means for receiving a control signal and to produce a current control signal, the current control signal being a ratio of a first current and a second current; means for applying a gain to an input voltage for producing an output voltage; and second means, in communication with the first means for receiving and the means for amplifying, for receiving the current control signal, the second means for receiving operable to adjust the gain responsive to a change in the control signal.

Advantageously, one proposed variable gain amplifier provides a linear control of exponential changes in an associated gain AV, such as a linear-in-dB gain. Moreover, the variable gain amplifier provides control (e.g., substantially linear) within a predetermined accuracy level despite adverse conditions such as temperature, supply voltage fluctuations, or fabrication process variations.

DESCRIPTION OF DRAWINGS

FIG. 1A is schematic diagram illustrating a variable gain amplifier.

FIG. 1B is a graph illustrating a linear relationship between a control current $I_{CTRL}$ and a gain $A_V$(dB).

FIG. 2 is schematic diagram illustrating a variable gain amplifier of FIG. 1A in greater detail.

FIG. 3A is a schematic diagram illustrating one implementation of a current steering control circuit.

FIG. 3B is a graph illustrating a linear relationship between a ratio of control current $I_{CTRL}$ and a current $I_B$ to a related natural log.

FIG. 4 is a flow diagram illustrating a method for varying gain amplification.

DETAILED DESCRIPTION

FIG. 1A is a schematic diagram of a variable gain amplifier 100. Variable gain amplifier 100 includes a control circuit 120, a gain circuit 130, and an amplifier circuit 140. Control circuit 120 is in communication with gain circuit 130 which in turn, is in communication with amplifier circuit 140. The components can be coupled by signal lines on an integrated circuit or a printed circuit board, by terminal connections, and the like. At a high level, variable gain amplifier 100 uses incremental adjustments to a control current $I_{CTRL}$ produced or received by control circuit 120 (shown in FIG. 2) for generating adjustments (in one implementation, exponential adjustments) to a gain $A_V$ of amplifier circuit 140.

In one implementation, control circuit 120 is a linear-to-exponential converter. Control circuit 120 can include, for example, various configurations of current sources as described in more detail below. Control circuit 120 has an output, a current control signal 122, that is coupled to gain circuit 130. Control circuit 120 produces current control signal 122 based on control current $I_{CTRL}$ as discussed in greater detail below. Control circuit 120 can be configured such that the production of control signal 122 is unaffected by conditions associated with variable gain amplifier 100. The adverse conditions can include ambient conditions such as temperature and supply voltage fluctuation, component properties, fabrication process variations, and other conditions that may adversely affect an accuracy of gain $A_V$.

Gain circuit 130 includes an input coupled to current control signal 122. Gain control circuit 130 also includes an output, a gain control signal 123, that drives inputs to amplifier circuit 140 responsive to current control signal 122 as described in more detail below. In the implementation shown, gain circuit 130 controls gain $A_V$ with a voltage value, but in other implementations, can control gain $A_V$ with a current value. In one implementation, gain circuit 130 is also unaffected by adverse conditions associated with variable gain amplifier 100 as described below.

Amplifier circuit 140 can be implemented using, for example, an operational amplifier, a two-stage amplifier, or any other type of current or voltage amplifying device. Amplifier circuit 140 includes inputs for receiving gain control signal 123 and an input signal $V_{IN}$, and an output for producing output signal $V_{OUT}$. Amplifier circuit 140 produces output signal $V_{OUT}$ from input signal $V_{IN}$ responsive to gain signal 123. Output signal $V_{OUT}$ can have higher or lower amplitudes and be in phase or out of phase relative to input signal $V_{IN}$. In one implementation described below, gain control signal 123 varies a balance of currents in amplifier circuit 140 by allowing either more or less current to be associated with output signal $V_{OUT}$. In another implementation described below, a closed loop relationship between transistors in gain circuit 130 and amplifier circuit 140 cancel out adverse conditions.

In one implementation, control circuit 120, gain circuit 130, and amplifier circuit 140 are disposed on separate substrates and, in another implementation, are integrated on a common substrate. Variable gain amplifier 100 can be included in a semiconductor device formed from silicon, gallium arsenide, and the like. Variable gain amplifier 100 can be, for example, a current steering type or other type of variable gain amplifier.

FIG. 1B is a graph 180 illustrating a linear relationship between control current $I_{CTRL}$ and gain $A_V$(dB) as produced in one implementation of the variable gain amplifier 100 of FIG. 1A. An x-axis 182 of graph 180 represents control current $I_{CTRL}$, and a y-axis 181 represents gain $A_V$(dB). Line 183 demonstrates that incremental adjustments to control current $I_{CTRL}$ yield linear adjustments to gain $A_V$(dB).

FIG. 2 is a schematic diagram of variable gain amplifier 100 in more detail. As in FIG. 1A, variable gain amplifier 100 includes control circuit 120, gain circuit 130, and amplifier circuit 140. The implementation shown is merely an example of a circuit configuration of variable gain amplifier 100. Other circuit configurations are possible.

Control circuit 120 includes current sources 211a,b and a current steering control circuit 129 including current source 111. Each of current sources 211a,b are referenced to a supply voltage $V_{DD}$. Current sources 111, 211a, and transistor 231 are in communication at a node X. Current sources 111, 211b and transistor 232 are in communication at a node Y. Control circuit 120 produces current control signal 122 that includes two currents, $I_{C1}$ and $I_{C2}$, as an output responsive to adjustments in current steering control circuit 129.

Gain circuit 130 includes transistors 231, 232, 255, 257 and 258, and resistor 256. In the differential signal implementation shown, transistors 231 and 232 form part of two gain control loops 280a and 280b, along with transistors 241, 242 and transistors 243, 244 in amplifier circuit 140. In gain control loop 280a, a base of transistor 231 is in communication with a base of transistor 242, a base of transistor 232 is in communication with a base of transistor 241, an emitter of transistor 231 is in communication with an emitter of transistor 232, and an emitter of transistor 241 is in communication with an emitter of transistor 242. In gain control loop 280b, the base of transistor 231 is in communication with a base of transistor 243, the base of transistor 232 is in communication with a base of transistor 244, and an emitter of transistor 243 is in communication with an emitter of transistor 244. Transistors 257, 258 are beta boosters that provide base current to transistors 231, 232 (and transistors 241, 244 of amplifier circuit 140) so that the base currents are not subtracted from respective collector currents ($I_{C1}$ and $I_{C2}$) which could cause inaccuracies in the gain control loops 280a and 280b. Transistor 255 along with resistor 256 sets the common mode voltage for the gain control loops 280a and 280b.

Amplifier circuit 140 includes two gain stages 140a and 140b. First gain stage 140a includes transistors 245 and 246, and a pair of filters including resistors 251, 252 and capacitors 253, 254. Transistor 245 is in communication with a positive terminal of input voltage $V_{IN}$ through capacitor 253. Transistor 246 is in communication with a negative terminal of input voltage $V_{IN}$ through capacitor 254. Transistor 245 is coupled to receive current $I_1$ and transistor 246 is coupled to receive current $I_2$ from the second gain stage 140b. Preferably, transistor 245 matches, or is substantially similar to, transistor 246.

Second gain stage 140b includes transistors 241–244 and a load $Z_L$ 259. Transistor 241 is in communication with a first terminal of load $Z_L$ 259 and a positive terminal of output voltage $V_{OUT}$. Transistor 244 is in communication with a second terminal of load $Z_L$ 259 and a negative terminal of output voltage $V_{OUT}$. In one implementation, transistors 241 and 242 are matching, and transistors 243 and 244 are matching. Load $Z_L$ 259 can be, for example, a resistor, a tuned load, a combination of resistors, any kind of narrowband or wideband load using inductors, capacitors, active circuits, and the like to provide a fixed loading to amplifier circuit 140. Transistors 241, 244 and transistors 242, 243 are coupled as shown to receive gain signal 123. Similarly, transistors 241, 242 and transistors 243, 244 of the second gain stage 140b produce currents $I_1$ and $I_2$ which are coupled to transistors 245 and 246 respectively of the first gain stage 140a as shown.

In one implementation, transistors 231, 232, 241 244 are implemented with bipolar junction transistors. In the same implementation, transistors 245, 246, and 255–258 can be, for example, bipolar junction transistors, metal oxide field effect transistors, or other types of transistors.

Operation

In control circuit 120, node X is coupled to receive source current $I_{B1}$ from current source 211a and in turn can source collector current $I_{C1}$ and control current $I_{CTRL}$. Node Y is coupled to receive source current $I_{B2}$ from current source 211b and control current $I_{CTRL}$, and sources collector current $I_{C2}$. Current steering control circuit 129, using current source 111, steers control current $I_{CTRL}$ from node X to node Y. As a result, collector current $I_{C1}$ substantially equates to $I_{B1}-I_{CTRL}$, and collector current $I_{C2}$ substantially equates to $I_{B1}+I_{CTRL}$. In the implementation shown, the output of control circuit 120 (i.e., current control signal 122) sent to gain circuit 130 includes two currents, collector currents $I_{C1}$ and $I_{C2}$.

In one implementation, control current $I_{CTRL}$ is a variable input to control circuit 120 and, in another implementation, currents $I_{B1}$ and/or $I_{B2}$ are also variable inputs. Further, control current $I_{CTRL}$ can be generated from a control signal received from an internal (e.g., on chip) or external source. Preferably, currents $I_{B1}$ and $I_{B2}$ are substantially equivalent to each other (in such case, $I_{B1}$ and $I_{B2}$ are both referred to herein as $I_B$), and are substantially larger than control current $I_{CTRL}$. Variable gain amplifier 100 can be configured such that a linear adjustment to a ratio $I_{CTRL}/I_B$ approximately produces a linear adjustment to gain $A_V$(dB). In one implementation, current steering control circuit 129 uses correction techniques to improve the approximate linearity, as discussed in greater detail below with respect to FIG. 3B.

In gain circuit 130, transistors 231 and 232 are coupled to receive collector currents $I_{C1}$ and $I_{C2}$ (i.e., control signal 122), respectively. Transistors 231 and 232 use collector currents $I_{C1}$ and $I_{C2}$ to adjust gain $A_V$ of amplifier circuit 140 by biasing components within the amplifier circuit 140 as discussed in greater detail below.

First gain stage 140a provides a gain $A_V1$ defined by $A_V1=\alpha$, where $\alpha$ is a function of a transconductance of transistors 245 and 246 and load 259 of second gain stage 140b. Transistors 245 and 246 amplify input voltage $V_{IN}$ by converting base-emitter voltages to currents $I_1$ and $I_2$ sunk from (or sourced to) second gain stage 140b.

Second gain stage 140b is coupled to both gain circuit 130 (by gain control signal 123) and first gain stage 140a. Gain stage 140b of amplifier circuit 140 provides a gain $A_V2$ defined by $A_V2=I_3/(I_3+I_4)$, where gain circuit 130 varies gain $A_V2$ between 0 (i.e., 0%) and 1 (i.e., 100%) by controlling a balance of current $I_1$ provided between outside current $I_3$ and inside current $I_4$. Accordingly, gain $A_V2$ is 1 when gain control signal 123 (by driving the base of transistor 241 relative to the base of transistor 242) results in substantially all of current $I_1$ being sourced (sunk) by current $I_3$ (i.e., by raising a base-emitter voltage of outer transistor 241). Gain $A_V2$ is 0 when gain circuit 130 steers all of current $I_1$ to be sourced (sunk) by current $I_4$ (i.e., by raising a base-emitter voltage of inner transistor 242). Gain $A_V2$ increases with current $I_3$ since more current is steered to load $Z_L$ 259. Overall gain $A_V$ of amplifier circuit 140 can be defined by $A_V=A_V1*A_V2=\alpha*I_3/(I_3+I_4)$. The amplifier circuit 140 shown, is configured for a differential input and output signal. Accordingly, transistors 243 and 244 are steered in a similar manner to achieve the proscribed gain (i.e., using gain control loop 280b). Alternatively, a single-ended configuration is possible that would eliminate transistors 243, 244 in second gain stage 140b and transistor 246 in first gain stage 140a (along with capacitor 254 and resistor 252).

As a result of gain control loop 280a, amplifier circuit 140 adjusts currents $I_3$ and $I_4$ responsive to a relationship between collector currents $I_{C1}$ and $I_{C2}$ (and similarly, as a result of gain control loop 280b, amplifier circuit 140 adjusts currents $I_5$ and $I_6$ responsive to the relationship between collector currents $I_{C1}$ and $I_{C2}$). Specifically, collector current ratio $I_{C1}/I_{C2}$ is substantially equivalent to current ratio $I_4/I_3$ (and $I_6/I_5$). The proportional relationships are derived as follows:

$$V_{BE1} - V_{BE2} + V_{BE3} - V_{BE4} = 0 \quad (1)$$

$$V_T \ln \frac{I_{C1}}{I_{S1}} - V_T \ln \frac{I_{C2}}{I_{S2}} + V_T \ln \frac{I_3}{I_{S3}} - V_T \ln \frac{I_4}{I_{S4}} = 0 \quad (2)$$

$$\frac{I_{C1}}{I_{C2}} = \frac{I_4}{I_3} \quad (3)$$

Equation (1) results from applying Kirchhoff's voltage law to base-emitter voltages ($V_{BE}$s) around gain control loop 280a (a similar result is found for gain control loop 280b). Equation (2) expresses $V_{BE}$s in terms of the subject currents (i.e., $I_{C1}$, $I_{C2}$, $I_3$, and $I_4$) along with thermal voltage ($V_T$) and saturation currents ($I_S$s). Assuming that transistor 231 is substantially similar to transistor 232, and that transistor 241 is substantially similar to transistor 242, $I_{S1}=I_{S2}$ and $I_{S3}=I_{S4}$. Accordingly, equation (2) reduces to an expression of currents in equation (3). Thus, control circuit 120 can change collector currents $I_{C1}$ and $I_{C2}$ in order to change a ratio of currents $I_4$ and $I_3$. Moreover, adverse conditions equally affecting collector currents $I_{C1}$ and $I_{C2}$, or currents $I_3$ and $I_4$, are cancelled out by the ratios.

Because of equation (3), control circuit 120 is able to adjust gain $A_V$ in amplifier circuit 140 as a function of control current $I_{CTRL}$. Specifically, control current $I_{CTRL}$ relates to gain $A_V$ as follows:

$$Av = \frac{V_{OUT}}{V_{IN}} = \quad (4)$$
$$(\alpha)\left(\frac{I_3}{I_3+I_4}\right) = \left(g_{m1} * \frac{Z_L}{2}\right)\left(\frac{I_{C2}}{I_{C1}+I_{C2}}\right) = \left(g_{m1} * \frac{Z_L}{2}\right)\left(\frac{I_B + I_{CTRL}}{2I_B}\right)$$

Equation (4) expresses gain $A_V$ in terms of the first and second stage gains $A_V1$ and $A_V2$ of amplifier circuit 140 described above. As discussed above, first stage gain $A_V1$ is equivalent to $\alpha$, and is related to transconductance gm1 of transistors 245, 246 and load $Z_L$ 259. Also as discussed above, the gain of the second stage $A_V2$ is a ratio of current $I_3$ relative to total current $I_1$ (and similarly, as a ratio of current $I_6$ relative to total current $I_2$) and is related to collector currents $I_{C1}$ and $I_{C2}$ by equation (3). Finally, collector currents $I_{C1}$ and $I_{C2}$ are related to control current $I_{CTRL}$ and current $I_B$ (e.g., current $I_{B1}$ and $I_{B2}$) as shown above.

In one implementation, linear adjustments in the control current provided by current source 111 can produce linear-in-dB adjustments in gain $A_V$. The linear relationship can be expressed through a Taylor series expansion as follows:

$$Av(dB) = 20 \log(Av) \quad (5)$$
$$= 20 \log\left(\frac{g_{m1}Z_L}{2} \frac{I_B + I_{CTRL}}{2I_B}\right)$$
$$= 20 \log\left(\frac{g_{m1}Z_L}{4}\right) + \frac{20}{\ln 10}\ln\left(1 + \frac{I_{CTRL}}{I_B}\right)$$
$$= const + \frac{20}{\ln 10}\ln(1 + X)$$

where $X = \frac{I_{CTRL}}{I_B}$ $$\ln(1+X) = \sum_{n=1}^{\infty} -1^{n+1}\frac{X^n}{n!} = X - \frac{X^2}{2} + \frac{X^3}{3}... \rightarrow \ln(1+X) \cong X, \quad (6)$$
$$X << 1$$

Equation (5) express gain $A_V$ in terms of dB. After substituting in the result of equation (4), gain(dB) can be expressed in terms of a Taylor series. The Taylor series expansion shown in equation (6) has a dominating term of X, followed by significantly less influencing terms, when X is significantly smaller than 1. Therefore, a natural log of (1+X) is approximately equivalent to X for very small X values (see FIG. 3B). Since here X represents a ratio $I_{CTRL}/I_B$, linear adjustments to ratio $I_{CTRL}/I_B$ result in linear-in-dB adjustments to gain $A_V$, particularly when current $I_B$ is significantly larger than control current $I_{CTRL}$.

In the implementation shown, variable gain amplifier 100 is specifically configured to generate linear-in-dB adjustments to gain $A_V$ (dB)(or gain-in-dB) as a function of incremental adjustments to control current $I_{CTRL}$. In alternative implementations, other relationships are possible with respect to the control current $I_{CTRL}$ and gain $A_V$ (e.g., logarithmically-linear with respect to base 10, parabolic, other functions, and gains other than in dB).

FIG. 3A is a schematic diagram illustrating one implementation of current steering control circuit 129. Current steering control circuit 129 includes current sources 311a–c and complementary switches 301–306. Current sources 311a–c are in communication with node X through switches 301, 303 and 305, respectively. Also, current sources 311a–c are in communication with node Y through switches 302, 304 and 306, respectively. Although the implementation shown includes three current sources 311a–c, other numbers of current sources are possible.

In operation, current steering control circuit 129 activates switches 301–306, each of which drives an increment of control current $I_{CTRL}$, to better approximate the Taylor series expansion discussed above. For example, by activating switch 302, current $\Delta I$ is sent to node Y. In turn, collector current $I_{C2}$ of FIG. 2 increases to $I_{B2}+\Delta I$. In one implementation, current sources 311a–c each have associated correction factors to improve linearity in gain. For example, correction current source 311a can have a correction factor of $\alpha$ and, when switch 302 is activated, current $(1+\alpha)\Delta I$ is sent to node Y. For an implementation of nonlinear correction factors, correction sources 311b, c can have larger correction factors of $\beta$, $\eta$, etc. Correction factors and performance are discussed immediately below.

FIG. 3B is a graph 380 illustrating a linear relationship between ratio $I_{CTRL}/I_B$ and a related natural log. An x-axis 381 of graph 380 represents X, or ratio $I_{CTRL}/I_B$, and a y-axis 382 represents the related natural log, or $\ln(1+X)$. While the desired linear response of a variable gain amplifier (e.g., variable gain amplifier 100) is represented by straight line 389, actual performance can be represented by slightly downward curving line 388. A current steering control (e.g., current steering control circuit 129 of FIG. 2) can use correction factors to improve the linearity of the variable gain amplifier's actual performance to compensate for this performance discrepancy. More specifically, a correction factor can be used to adjust (e.g., multiply) the control current value used in producing currents $I_{C1}$, and $I_{C2}$ of FIG. 2 so as to correct the actual performance to produce a desired performance result. As linearity degrades, larger correction factors can be applied to better approximate the Taylor series expansion.

FIG. 4 is a flow chart illustrating a method 400 for varying gain amplification. A control circuit (e.g., control circuit 120) receives 410 a control current or a control voltage indicative of a desired gain $A_V$ in an amplifier circuit (e.g., amplifier circuit 140). In response, the control circuit produces 420 a current control signal unaffected by conditions associated with the amplifier (e.g., temperature, supply voltage fluctuations, or process variations). In one implementation, the control uses correction factors to produce a current control signal for improved linearity in gain (dB) (e.g., with current sources 331a–c).

A gain circuit (e.g., gain circuit 120) produces 430 a gain control signal (e.g., in a gain voltage loop 280) from the current control signal. The gain control signal adjusts an amplifier gain $A_V$ such that linear changes in the current control signal produce a desired (e.g., logarithmically-linear change) adjustment in the amplifier circuit gain $A_V$ (e.g., in dB). The amplifier circuit applies 440 the adjusted gain $A_V$ to produce an output voltage $V_{OUT}$ from an input voltage $V_{IN}$.

Variable gain amplifier 100 can be implemented as a component of programmable gain amplifiers, wireless and wireline transmitters and receivers, storage systems, multimedia components (audio and video), and the like. For example, variable gain amplifier 100 can be implemented in a transmitter as a control for output power. In another example, variable gain amplifier 100 can be implemented in a receiver as a control for optimum sensitivity. A digital interface can input discrete increases or decreases in control current $I_{CTRL}$ in order to produce logarithmically-discrete gain changes.

A number of implementations have been described. Nevertheless, it will be understood that various modifications may be made. Accordingly, other implementations are within the scope of the following claims.

What is claimed is:

1. A circuit, comprising:
   a control circuit operable to receive a control signal and to produce a current control signal, the current control signal being a ratio of a first current and a second current;
   an amplifier circuit, responsive to an input signal, to apply a gain to an input voltage for producing an output voltage; and
   a gain circuit in communication with the control circuit and the amplifier circuit and receiving the current control signal, the gain circuit operable to adjust the gain including adjusting the input signal responsive to a change in the control signal.

2. A circuit, comprising:
   a control circuit operable to receive a control signal and to produce a current control signal, the current control signal being a ratio of a first current and a second current;
   an amplifier circuit, responsive to an input signal, to apply a gain to an input voltage for producing an output voltage; and
   a gain circuit in communication with the control circuit and the amplifier circuit and receiving the current control signal, the gain circuit operable to adjust the gain including adjusting the input signal responsive to a change in the control signal, wherein the gain circuit adjusts the gain to a predetermined accuracy level independent of variations in one or more conditions selected from the group including temperature, voltage supply level, and fabrication process.

3. A circuit, comprising:
   a control circuit operable to receive a control signal and to produce a current control signal, the current control signal being a ratio of a first current and a second current;
   an amplifier circuit, responsive to an input signal, to apply a gain to an input voltage for producing an output voltage; and
   a gain circuit in communication with the control circuit and the amplifier circuit and receiving the current control signal, the gain circuit operable to adjust the gain including adjusting the input signal responsive to a change in the control signal, wherein the gain circuit produces a gain control signal to adjust the gain as a function of the control signal.

4. The circuit of claim 3, wherein the gain circuit is operable to substantially linearly adjust the gain on a logarithmic scale in response to an incremental change in the control signal.

5. The circuit of claim 3, wherein the function is one selected from the group including substantially exponential and parabolic.

6. A circuit, comprising:
   a control circuit operable to receive a control signal and to produce a current control signal, the current control signal being a ratio of a first current and a second current, wherein the control circuit further comprises a current steering control operable to steer the current control signal responsive to adjustments in the control signal including incremental changes in a control current;
   an amplifier circuit, responsive to an input signal, to apply a gain to an input voltage for producing an output voltage; and
   a gain circuit in communication with the control circuit and the amplifier circuit and receiving the current control signal, the gain circuit operable to adjust the gain including adjusting the input signal responsive to a change in the control signal.

7. The circuit of claim 6, wherein the incremental changes to the control current are nonlinear.

8. The circuit of claim 6, wherein the control circuit further comprises:
   a first current source in communication with a first node, the first current source operable to produce a first source current that is substantially larger than a control current associated with the control signal; and a second current source in communication with a second node, the second current source operable to produce a second source current substantially equal to the first source current; and a current steering control in communication with the first and second current sources, the current steering control operable to steer the current control signal responsive to adjustments in the control signal, such that the first node produces the first current and the second node produces the second current.

9. The circuit of claim 8, wherein the first current substantially equates to the first source current less the control current, and the second current substantially equates to the second source current plus the control current.

10. The circuit of claim 9, wherein the current steering control is operable to produce the control signal.

11. The circuit of claim 3, wherein the gain circuit produces a gain control signal to control the gain, and in response, the amplifier circuit produces a fourth current and a third current proportional to the first current and the second current, the gain in the amplifier circuit being proportional to a ratio of the third current and a sum of the third and fourth currents.

12. A circuit, comprising:
   a first input to receive a first source current;
   a second input to receive a second source current substantially equal to the first source current;
   a current steering control in communication with the first and second source currents, the current steering control operable to receive a control signal and steer a current control signal responsive to adjustments in the control signal including producing a first current and a second current;
   a gain circuit in communication with the current steering control including a first transistor operable to receive the first current and a second transistor operable to receive the second current; and
   an amplifier circuit including a third transistor operable to receive a third current and a fourth transistor operable to receive a fourth current,
   where the first, second, third and fourth transistors are coupled such that a ratio of the first and second currents is proportional to a ratio of the fourth and third currents, and produces a gain in the amplifier circuit as a ratio of the third current and a sum of the third and fourth currents.

13. The circuit of claim 12, wherein the amplifier circuit further comprises:
   a fifth transistor operable to receive a fifth current; and
   a sixth transistor operable to receive a sixth current;
   where the first, second, fifth, and sixth transistors are coupled such that a ratio of the first and second currents is proportional to a ratio of the sixth and fifth currents, and produces a gain as a ratio of the sixth current and a sum of the fifth and sixth currents.

14. The circuit of claim 13, wherein the first through sixth transistors each comprise a bipolar junction transistor.

15. The circuit of claim 12, wherein the control signal is one selected from the group including a control current and a control voltage.

16. The circuit of claim 12, further comprising:
   a first current source in communication with a first node, the first current source operable to produce the first source current that is substantially larger than a control current associated with the control signal; and
   a second current source in communication with a second node, the second current source operable to produce the second source current substantially equal to the first source current.

17. The circuit of claim 16, wherein the first current substantially equates to the first source current less the control current, and the second current substantially equates to the second source current plus the control current.

18. The circuit of claim 17, wherein the current steering control comprises:
   one or more current sources operable to produce current signals; and
   one or more switches in communication with the one or more current sources, each of the one or more switches operable to adjust the control current responsive to the control signal including activating a current source to increase the control current and deactivating the current source to reduce the control current.

19. The circuit of claim 12, wherein the current steering control is operable to produce the control signal.

20. The circuit of claim 12, wherein the current steering control further comprises:
   a first current source producing a first approximating current; and
   a second current source producing a second approximating current that reflects a nonlinear increment with respect to the first approximating current.

21. The circuit of claim 12, wherein the gain circuit produces a gain control signal to adjust the gain as a function of the control signal.

22. The circuit of claim 21, wherein the function is one selected from the group including substantially exponential and parabolic.

23. The circuit of claim 12, wherein the amplifier circuit includes one the group including a single-ended amplifier and a differential amplifier.

24. The circuit of claim 12, wherein the amplifier circuit is included in an integrated circuit.

25. A method, including:
   receiving a control signal;
   producing a current control signal, the current control signal being a ratio of a first current and a second current;
   applying a gain to an input voltage for producing an output voltage; and
   adjusting the gain responsive to a change in the control signal.

26. A method, including:
   receiving a control signal;
   producing a current control signal, the current control signal being a ratio of a first current and a second current;
   applying a gain to an input voltage for producing an output voltage; and
   adjusting the gain responsive to a change in the control signal, wherein adjusting the gain includes adjusting the gain to a predetermined accuracy level independent of variations in one or more conditions selected from the group including temperature, voltage supply level, and fabrication process.

27. A method, including:
   receiving a control signal;
   producing a current control signal, the current control signal being a ratio of a first current and a second current;
   applying a gain to an input voltage for producing an output voltage; and adjusting the gain responsive to a change in the control signal, wherein adjusting the gain includes producing a gain control signal to adjust the gain as a function of the control signal.

28. The method of claim 27, wherein adjusting the gain includes substantially linearly adjusting the gain on a logarithmic scale in response to an incremental change in the control signal.

29. The method of claim 27, wherein the function is one selected from the group including substantially exponential and parabolic.

30. A method, including:
receiving a control signal;
producing a current control signal, the current control signal being a ratio of a first current and a second current;
steering the current control signal responsive to adjustments in the control signal including incremental changes in a control current;
applying a gain to an input voltage for producing an output voltage; and
adjusting the gain responsive to a change in the control signal.

31. The method of claim 30, wherein the incremental changes to the control current are nonlinear.

32. The method of claim 31, further comprising:
producing a first source current at a first node that is substantially larger than a control current associated with the control signal; and
producing a second source current at a second node that is substantially equal to the first source current; and
steering the current control signal responsive to adjustments in the control signal; such that the first node produces the first current and the second node produces the second current.

33. The method of claim 32, wherein the first current substantially equates to the first source current less the control current, and the second current substantially equates to the second source current plus the control current.

34. The method of claim 25, further comprising: producing the control signal.

35. The method of claim 27, further comprising:
producing a gain control signal to control the gain, and in response, producing a fourth current and a third current a ratio of which is proportional to a ratio of the first current and the second current, the gain being proportional to a ratio of the third current and a sum of the third and fourth current.

36. A method, including:
producing a first source current;
producing a second source current substantially equal to the first source current; receiving a control signal;
steering a current control signal responsive to adjustments in the control signal including producing a first current and a second current; equating a ratio of a fourth current and a third current to a ratio of the first and second currents; and
generating a gain as a ratio of the third current and a sum of the third and fourth currents.

37. The method of claim 36, further including: receiving a fifth current;
receiving a sixth current;
equating a ratio of the sixth and fifth currents to a ratio of the first and second currents; and generating the gain as a ratio of the sixth current and a sum of the fifth and sixth currents.

38. The method of claim 37, wherein the first through sixth currents are each produced by a bipolar junction transistor.

39. The method of claim 36, wherein the control signal is one selected from the group including a control current and a control voltage.

40. The method of claim 36, further comprising:
producing the first source current that is substantially larger than a control current associated with the control signal; and
producing the second source current substantially equal to the first source current.

41. The method of claim 40, wherein the first current substantially equates to the first source current less the control current, and the second current substantially equates to the source current plus the control current.

42. The method of claim 41, further comprising:
producing one or more current signals; and
adjusting the control current responsive to the control signal including coupling a current signal to increase the control current and decoupling the current signal to reduce the control current.

43. The method of claim 36, further comprising: producing the control signal.

44. The method of claim 36, wherein steering the current control signal comprises:
producing a first approximating current;
producing a second approximating current that reflects a nonlinear increment with respect to the first approximating current; and
selecting one or more of the approximating currents to be combined with the control current.

* * * * *